(12) United States Patent
Kim et al.

(10) Patent No.: US 10,030,838 B2
(45) Date of Patent: Jul. 24, 2018

(54) VEHICLE LAMP AND VEHICLE INCLUDING THE SAME

(71) Applicant: LG INNOTEK CO., LTD., Seoul (KR)

(72) Inventors: Ji Hoon Kim, Seoul (KR); Dong Kyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 97 days.

(21) Appl. No.: 15/166,935

(22) Filed: May 27, 2016

(65) Prior Publication Data

US 2016/0348870 A1  Dec. 1, 2016

(30) Foreign Application Priority Data

May 28, 2015 (KR) .................. 10-2015-0075281

(51) Int. Cl.
| | | |
|---|---|---|
| *B60Q 1/00* | (2006.01) | |
| *F21S 8/10* | (2006.01) | |
| *H01L 35/30* | (2006.01) | |
| *H01L 35/32* | (2006.01) | |
| *F21S 45/33* | (2018.01) | |
| *F21S 45/60* | (2018.01) | |
| *F21S 45/49* | (2018.01) | |
| *F21S 45/43* | (2018.01) | |
| *F21S 45/47* | (2018.01) | |

(52) U.S. Cl.
CPC .............. *F21S 48/335* (2013.01); *F21S 45/33* (2018.01); *F21S 45/60* (2018.01); *H01L 35/30* (2013.01); *H01L 35/32* (2013.01); *F21S 45/43* (2018.01); *F21S 45/47* (2018.01); *F21S 45/49* (2018.01)

(58) Field of Classification Search
CPC .................. F21S 48/00–48/34; F21V 29/54
See application file for complete search history.

(56) References Cited

U.S. PATENT DOCUMENTS

| | | | |
|---|---|---|---|
| 2007/0289621 A1 * | 12/2007 | Horio | ................ F21S 9/04 136/205 |
| 2011/0310631 A1 | 12/2011 | Davis | |
| 2016/0204329 A1 | 7/2016 | Cho et al. | |

FOREIGN PATENT DOCUMENTS

| | | | |
|---|---|---|---|
| DE | 102011084114 A1 * | 4/2013 | ............ F21S 48/34 |
| DE | 102011084114 A1 | 4/2013 | |
| DE | 102011089945 A1 | 6/2013 | |
| EP | 2014972 A1 | 1/2009 | |
| WO | WO 2014/116160 A1 | 7/2014 | |
| WO | WO 2015/026159 A1 | 2/2015 | |

* cited by examiner

*Primary Examiner* — Sean Gramling
(74) *Attorney, Agent, or Firm* — Birch, Stewart, Kolasch & Birch, LLP

(57) ABSTRACT

According to an embodiment of the present invention, provided is a vehicle lamp including a housing, a lens unit that is provided on a front surface of the housing, a light source unit that is arranged to be spaced apart from the lens unit by a predetermined distance and thereby forms a separation space, a thermoelectric module that is provided inside the housing, an air flow passage unit that provides an air movement passage between the thermoelectric module and the separation space, and a thermoelectric circulating unit that provides power so that air passing through the thermoelectric module is discharged to the separation space along the air movement passage.

18 Claims, 9 Drawing Sheets

(a)

(b)

(c)

(d)

(a)

(b)

(c)

(d)

VEHICLE LAMP AND VEHICLE INCLUDING THE SAME

CROSS-REFERENCE TO RELATED APPLICATION

This application claims priority to and the benefit of Korean Patent Application No. 2015-0075281, filed on May 28, 2015, the disclosure of which is incorporated herein by reference in its entirety.

BACKGROUND

1. Field of the Invention

The present invention relates to a vehicle lamp that removes dew condensation on a lens unit and a vehicle including the same.

2. Discussion of Related Art

As a head lamp of a vehicle is used to illuminate the front of a vehicle during operation of the vehicle, a light source is provided inside the head lamp, and the emitted from the light source irradiates the front of the vehicle in both upper and lower directions.

Due to a high temperature environment created due to heat of the light source itself of such a head lamp and heat transmitted from the engine of the vehicle and the like, a temperature difference between the head lamp and the outside is generated which leads to generation of dew condensation inside the head lamp.

The problem of the generation of moisture inside the head lamp leads to failure of a light source unit of the head lamp and a reduction of merchantability and has been recognized as a chronic problem of a vehicle headlamp system for which a variety of solutions have been proposed, however, there has been no fundamental solution.

SUMMARY OF THE INVENTION

The present invention is directed to a vehicle lamp in which an air blowing structure may be simplified by providing an air flow passage unit that is provided in a bezel unit provided in the vicinity of a light source of the vehicle lamp as a necessity and in which the capacity requirement of a thermoelectric module and an air-blowing module may be remarkably reduced by selectively providing air to a local area of a lens surface and to a vehicle including the same.

According to an aspect of the present invention, there is provided a vehicle lamp including: a housing; a lens unit that is provided on a front surface of the housing; a light source unit that is arranged to be spaced apart from the lens unit by a predetermined distance to form a separation space; a thermoelectric module that is provided inside the housing; an air flow passage unit that provides an air movement passage between the thermoelectric module and the separation space; and a thermoelectric circulating unit that provides power so that air passing through the thermoelectric module is discharged to the separation space along the air movement passage.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
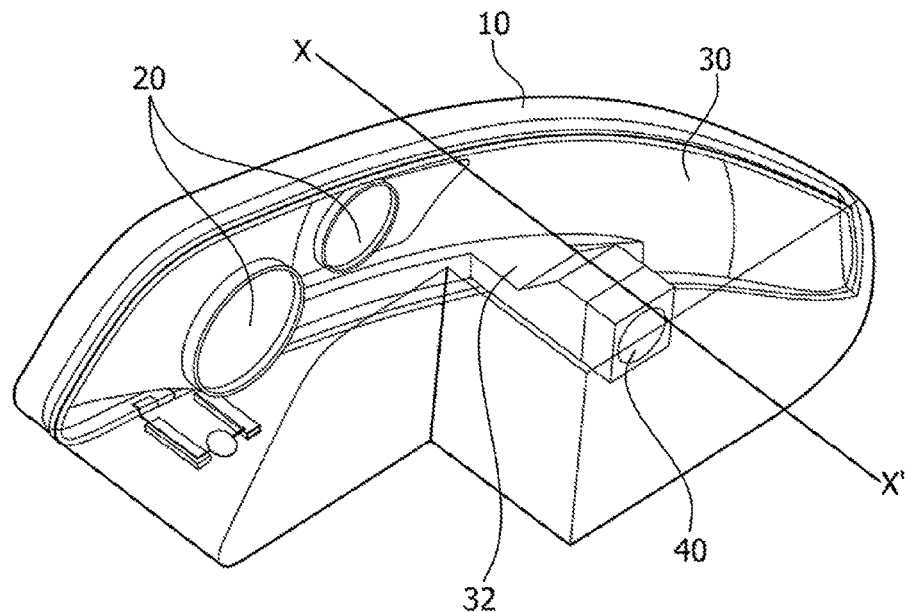
FIG. 1 is a perspective view of a structure of a vehicle lamp according to an exemplary embodiment of the present invention viewed from the rear.

Advantages and features of the present invention and a method for achieving the same will become explicit by referring to the exemplary embodiments that are described in detail in the following with reference to the accompanying drawings. In the specification and the drawings, the same reference numerals will be given to the components having substantially the same functional configurations, and the repetitive description thereof will be omitted. It will be understood that, although the terms first, second, etc. may be used herein to describe various elements, these elements should not be limited by these terms. These terms are only used to distinguish one element from another.

Figure 2:
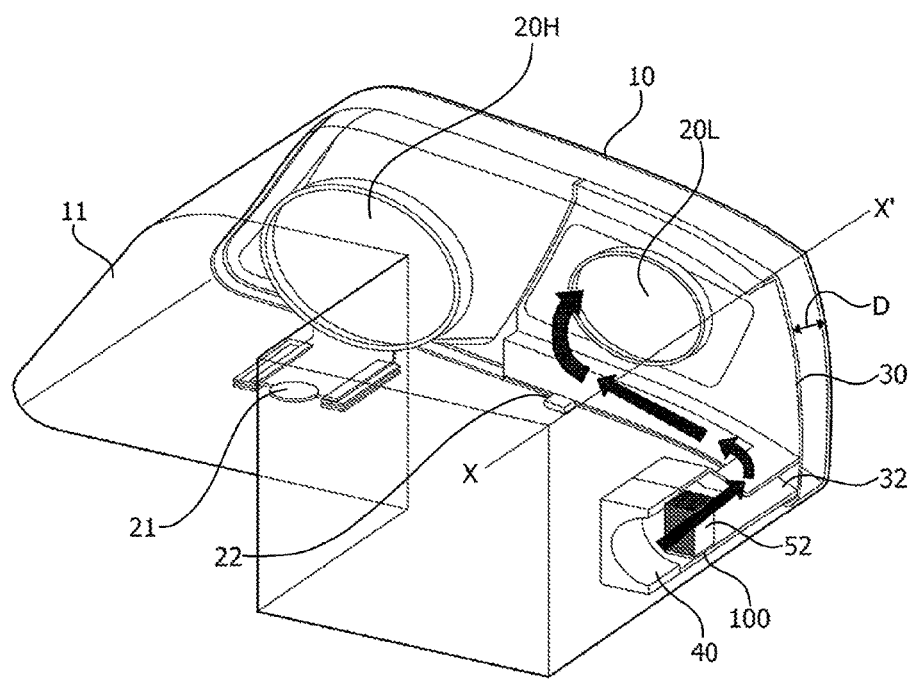
FIG. 2 is a partial cross-sectional view taken along a line X-X' of FIG. 1.

FIG. 1 is a perspective view of a structure of a vehicle lamp according to an exemplary embodiment of the present invention is viewed from the rear, and FIG. 2 is a partial cross-sectional view taken along a line X-X' of FIG. 1.

Referring to FIGS. 1 and 2, a vehicle lamp according to an exemplary embodiment of the present invention may include a housing 11, a lens unit 10 provided on a front surface of the housing, a light source unit 20 that is arranged to be spaced apart from the lens unit 10 by a predetermined distance to form a separation space, a thermoelectric module 100 provided inside the housing 11, an air flow passage unit 32 that provides an air movement passage between the thermoelectric module 100 and the separation space, and a thermoelectric circulating unit 40 that provides power so that air passing through the thermoelectric module 100 is discharged to the separation space along the air movement passage.

In a structure of the vehicle lamp according to an exemplary embodiment of the present invention, the thermoelectric circulating unit 40 that provides warm air in order to remove dew condensation generated in a surface area of the lens unit 10 may be provided, the warm air may be obtained through the implementation of the thermoelectric module 100, and at the same time the movement of the warm air may be guided through the air flow passage unit 32 implemented on the inner or outer surface of the bezel unit 30 to directly provide the warm air not only to the entire surface of the lens unit 10 but also to a local area such as an edge portion of the lens in which dew condensation is particularly frequently generated to make it possible to prevent the generation of dew condensation.

Specifically, referring to FIG. 2, in the structure of the vehicle lamp according to an exemplary embodiment of the present invention, the lens unit 10 may be an outer lens which is located at the outermost part of a head lamp of the vehicle and combined along the edge of the housing 11 of the lamp to form the overall exterior of the lamp. One or a plurality of light source units 20 that emits light to the outside through the lens unit 10 may be implemented, and in an exemplary embodiment of the present invention, a structure in which the light source unit 20 includes a low beam 20L and a high beam 20H will be described. The light source unit 20 is a concept that encompasses a structure having a light-emitting package including a variety of solid-state light-emitting devices including halogen lamp, HID lamp, LED, LD, OLED, and the like.

The bezel unit may be provided in the separation space. That is, the bezel unit 30 that is an intermediate cover member for an aesthetic inside of the lamp and performs functions such as reflecting function may be provided in a peripheral portion of a light-emitting surface of the light source unit 20. In the present embodiment, a flow passage through which air is movable may be formed on the surface of the bezel unit 30 and guide air provided through the thermoelectric circulating unit 40 which will be described later so that warm air may flow from the surface of the bezel unit 30 to the lens unit 10 and the separation space D of the light source unit 20.

The thermoelectric circulating unit 40 may include a device capable of making air flow such as a blower fan and move a constant quantity of air forward by driving the blower fan (red arrow) when power is supplied. In this case, a first thermal conversion member 52 which is arranged in an air movement passage of the thermoelectric circulating unit 40, constitutes a heat generating portion of the thermoelectric module 100 and performs a heatsink function is disposed. Air passing through the first thermal conversion member 52 that performs a heat generating function according to the effect of the thermoelectric module 100 may be heated and converted into warm air, and the air converted into the warm air may move toward a front portion of the bezel unit 30 along the air flow passage unit 32.

A temperature sensor unit (not shown) may detect a temperature difference between the separation space of the inside of the housing and the outside of the housing. The temperature sensor unit may include a temperature sensor that is provided in the separation space of the inside of the housing and a temperature sensor that detects an external temperature of the housing, and the temperature sensor that detects the external temperature of the housing may use temperature data of the temperature sensor mounted in advance to detect an external temperature of the vehicle.

A control unit (not shown) may control operations of the thermoelectric circulating unit according to a temperature difference. The control unit may calculate the temperature difference using the temperature of the separation space of the inside of the housing and the external temperature of the housing which have been detected by the temperature sensor unit and analyze a likelihood of generation of dew condensation including indices including possibility of dew condensation, level of dew condensation, and the like according to the calculated temperature difference. The control unit may control operation and non-operation of the thermoelectric circulating unit 42, air quantity, and the like according to the likelihood of generation of dew condensation, and when the thermoelectric circulating unit includes a plurality of air-blowing modules, the control unit may independently control each of the plurality of air-blowing modules to effectively prevent the generation of dew condensation while minimizing power consumption.

Figure 3:
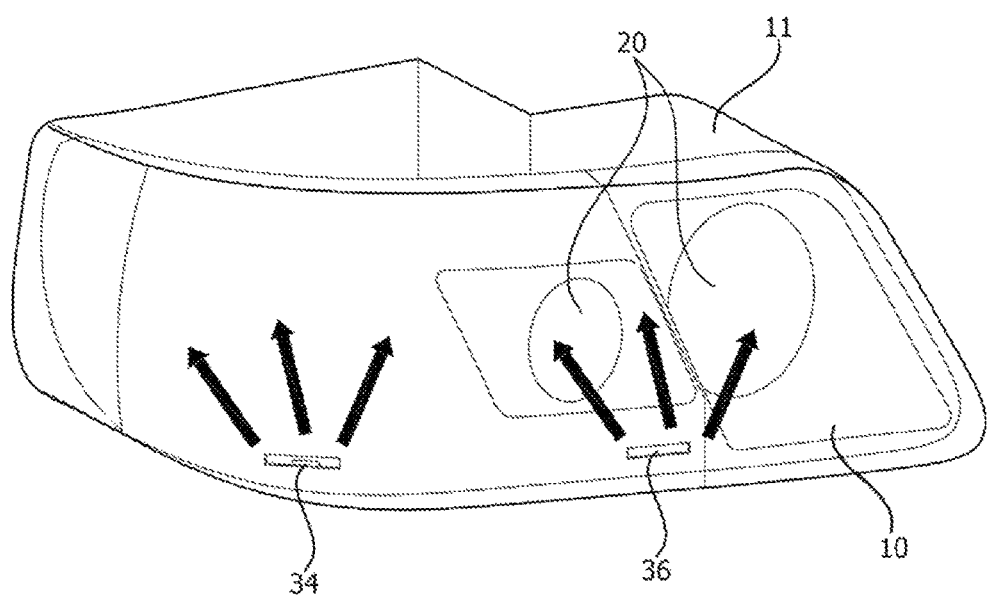
FIG. 3 is an operational state view showing a structure in which the structure of FIG. 1 is viewed from the front.

FIG. 3 is a view showing an operation in which warm air guided along the air flow passage unit 32 in FIG. 2 is discharged through air discharge portions 34 and 36 arranged on the surface of the bezel unit 30. The air discharge portions 34 and 36 may be arranged in at least two areas of surface areas of the bezel unit so that warm air may be intensively applied to a region of the local area in which dew condensation is frequently generated, thereby improving the efficiency by removing the dew condensation even with small power. In FIG. 3, an example in which the air discharge portions 34 and 36 are formed to have a structure in which warm air is intensively flowed to a lower end of the lens unit 10 is shown, but the present invention is not limited thereto and the air discharge portions 34 and 36 may be implemented in the form of one or a plurality of holes or slits in left and right edge portions of the lens unit 10 or other edges thereof. The shape of the air discharge portions 34 and 36 may be variously changed into a wedge-shaped hole structure in which air can be diffused to the surface of the lens to control the direction of the wind or a slit structure having a predetermined length, etc.

Accordingly, one end of the air flow passage unit 32 may communicate with the thermoelectric circulating unit 40, the other end thereof may communicate with the separation space D, and the thermoelectric module 100 may be provided between the one end of the air flow passage unit 32 and the thermoelectric circulating unit 40. In addition, although an example in which the air flow passage unit 32 is arranged on an outer surface of the bezel unit 30 is shown in the structure implemented in FIG. 2, in another example, a structure in which a flow passage is formed inside the bezel unit may be implemented. In this case of forming the flow passage is inside the bezel unit, the outer structure of the bezel unit may be generally simplified and reduced in thickness so that there may be an advantage of securing a wider space for placing the thermoelectric module and the thermoelectric circulating unit which are mounted in a limited space.

In addition, one or more second air-blowing modules such as a blower fan having an auxiliary function which can be controlled to enhance a flow of air may be arranged inside the air flow passage unit 32. This is because, as described above, it is difficult to realize air quantity and air pressure of a desired output with the arrangement structure for the thermoelectric circulating unit 40 including a single first air-blowing module (42; see FIG. 4) shown in FIG. 2 whose placement location is extremely limited to a front portion of the vehicle due to the fact that design freedom is limited due to a limitation of a space for placement of the lamp, and therefore an auxiliary blower fan may be provided to implement a larger air pressure.

Alternatively, according to another embodiment, it is obvious that, rather than being limited to a structure including the single air-blowing module and the single thermoelectric module shown in the structure shown in FIG. 2, the structure of the vehicle lamp may be changed into a structure in which a plurality of thermal conversion members (for example, heatsink member) including a plurality of thermoelectric modules to implement warm air are implemented and a plurality of blower fans are provided or into a structure in which a plurality of blower fans share a single thermoelectric module, etc.

Figure 4:
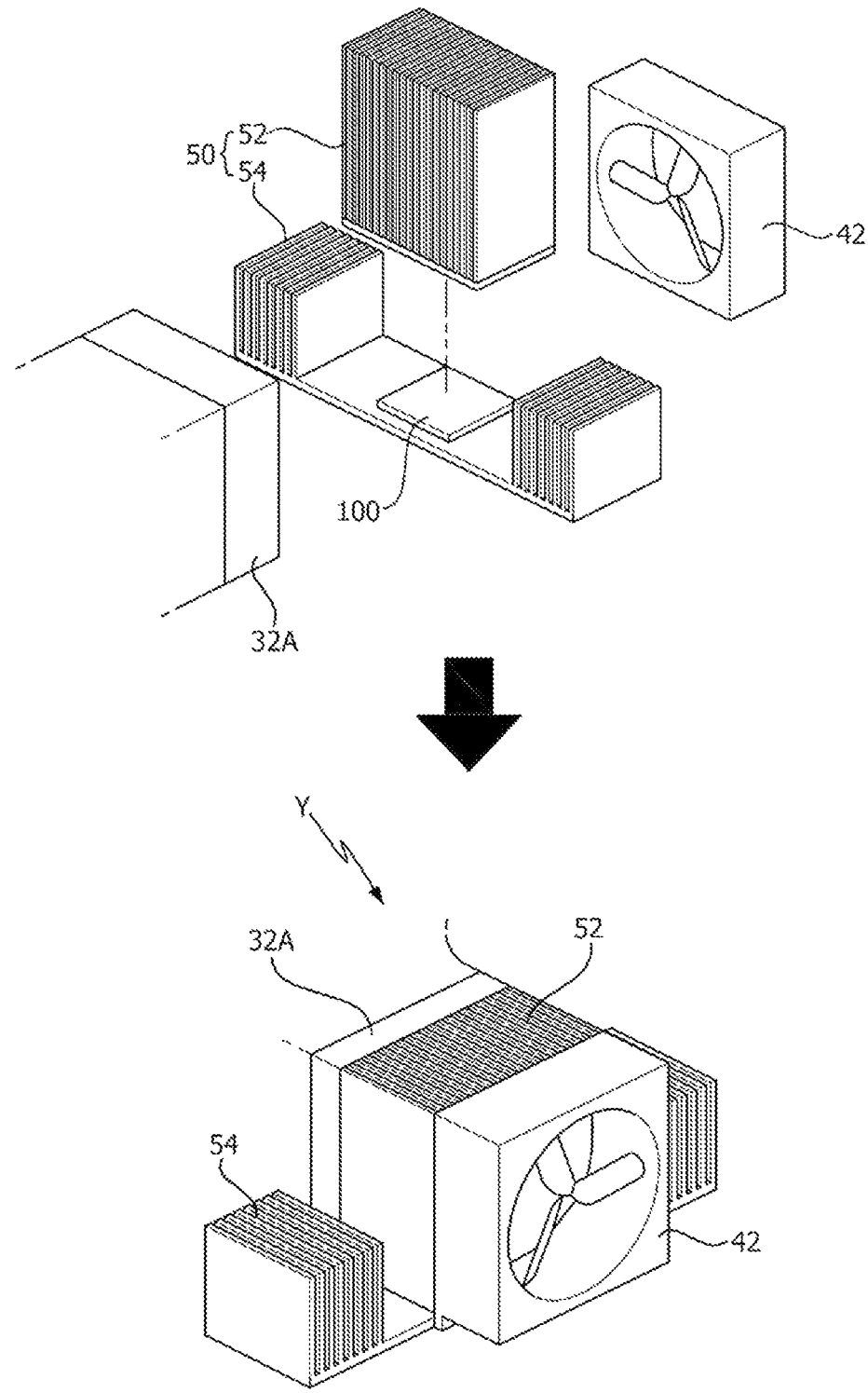
FIGS. 4 and 5 are conceptual views showing a structure of a thermoelectric circulating unit according to an exemplary embodiment of the present invention.
Figure 5:
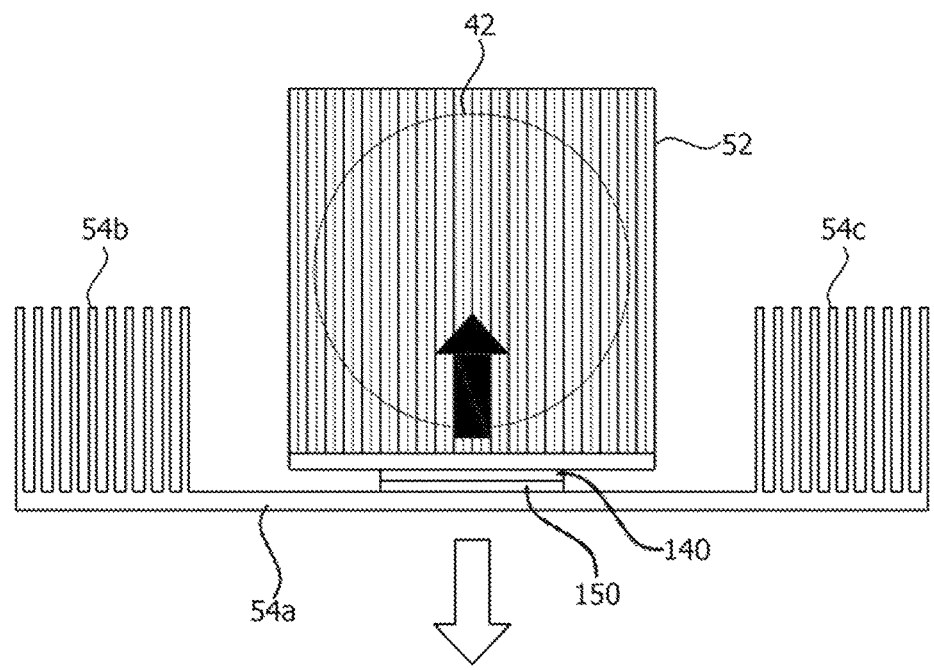

FIGS. 4 and 5 are conceptual views of the main portions for describing an arrangement relationship between the thermoelectric circulating unit 40 and the adjacent structure in FIG. 2.

Referring to FIGS. 2, 4 and 5, the thermoelectric circulating unit 40 of FIG. 2 may include a first air-blowing module 42. In addition, although not shown, the thermoelectric circulating unit 40 may include various components such as a power unit for applying power to the first air-blowing module 42, a wiring unit, a circuit board provided with a control unit, and the like.

The thermoelectric module 100 may be arranged in the direction of the flow of air in accordance with the thermoelectric circulating unit 40 as described above, and the air may be converted into warm air while passing through the first thermal conversion member 52 provided in the thermoelectric module 100. Next, the obtained warm air may be guided along the air flow passage unit via an end portion 32A of the air flow passage unit. In terms of efficiency to ensure a sufficient air flow, as shown in FIG. 4, the end portion 32A of the air flow passage unit and the first thermal conversion member 52 may be arranged adjacent to each other, and one or more first air-blowing modules 42 may be arranged on a rear surface of the first thermal conversion member 52.

FIG. 5 is a conceptual view showing a structure viewed from a direction 'Y' of FIG. 4.

The thermoelectric module applied to the exemplary embodiment of the present invention may be implemented to have a structure in which a plurality of thermoelectric semiconductor devices are provided between a first substrate 140 and a second substrate 150 facing each other. In this case, the area of the first substrate 140 may be implemented as a heat generating area due to the thermoelectric effect, and a structure such as the first thermal conversion member 52 may be arranged on the first substrate 140 as shown in FIG. 5. The first air-blowing module 42 may be disposed behind the first thermal conversion member 52 so that air passing through the thermal conversion member 52 may be converted into warm air. At this point, the first thermal conversion member 52 arranged on the first substrate and one end of the air flow passage unit 32 may communicate with each other, and a vertical cross-sectional area of the first thermal conversion member 52 and a vertical cross-sectional area of the one end of the air flow passage unit 32 may be provided in the same manner within a predetermined tolerance. That is, the first thermal conversion member 52, the thermoelectric module 100, and the thermoelectric circulating unit 42 may be provided in a manner to sequentially communicate with one another, and a vertical cross-sectional area of a contact portion among these may be made the same within a predetermined tolerance so that warm air passing through the first thermal conversion member 52 may pass through the air flow passage unit 32 without leaking to the outside.

In addition, the second substrate 150 is a component that performs a heat absorbing function, and according to the present exemplary embodiment, a second thermal conversion member 54 in contact with the second substrate 150 may be arranged.

The second thermal conversion member 54 may be provided to be spaced apart from the first thermal conversion member 52 by a predetermined distance. The second thermal conversion member 54 may be formed to have the same shape as the first thermal conversion member, but as shown in FIGS. 4 and 5, the second thermal conversion member 54 may be formed to include a first area 54a adhered to the second substrate 150 and a second area in which radiation fins 54b and 54c are formed at an end or both ends of the first area 54a. The second thermal conversion member 54 may condense the moisture in the housing 11 of the lamp in the structure of FIG. 2 to reduce the humidity, and although not shown, the second thermal conversion member 54 may be brought into contact with a structure such as a peripheral reflecting member of the light source unit 10 in the structure of FIG. 2 and remove the heat generated from the light source so that heat radiation effect may be implemented. When the second thermal conversion member 54 is brought into contact with a portion of the light source unit that generates heat in this manner, temperature of a cooling unit of the thermoelectric module increase to a certain temperature in addition to the effect of radiating the heat generated from the light source, so that a temperature of the heat generating portion of the thermoelectric module may further increase according to a fixed thermoelectric capacity $\Delta T$ of the thermoelectric module, thereby more efficiently increasing a temperature of warm air (for example, when a temperature variation $\Delta T$ of each of the heat generating portion and cooling unit of the thermoelectric module applied to the exemplary embodiment of the present invention is 40° C., the temperature of the cooling unit is 40° C., and the temperature of the heat generating portion is 80° C., a temperature at which air can be converted into warm air is normally 80° C., but when the second thermal conversion member is brought into contact with the light source unit to cause the temperature of the cooling unit to increase to 50° C., the highest temperature of the heat generating portion may increase up to 90° C. by virtue of the fixed $\Delta T$ (40° C.). In this case, the temperature of the warm air may increase to 90° C. which leads to an advantage of implementing the wind of a relatively high temperature with the same power).

In addition, the second thermal conversion member (54; 54a to 54c) shown in FIG. 5 may be designed to be exposed to the outside of the air flow passage unit 32 in the structure of FIG. 2, and this causes only the warm air to be guided within the air flow passage unit, thereby enhancing the effect of removing dew condensation.

Hereinafter, various embodiments of a thermoelectric module applied to the above-described vehicle lamp according to an exemplary embodiment of the present invention will be described.

Figure 6:
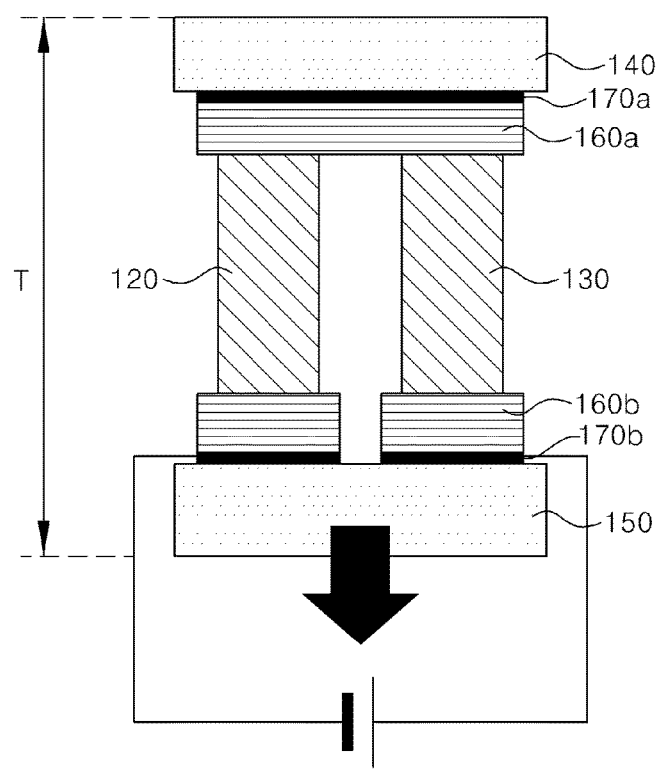
FIG. 6 is a cross-sectional view showing a main portion of a thermoelectric module according to an exemplary embodiment of the present invention applied to the vehicle lamp of FIG. 2.
Figure 7:
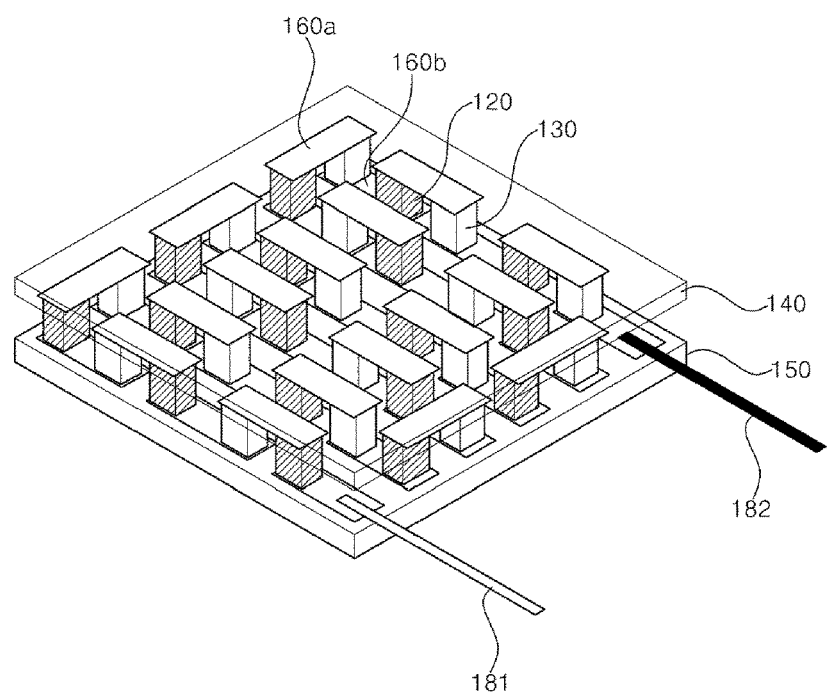
FIG. 7 is a view showing an example in which the structure of FIG. 6 is modularized and expanded.

FIG. 6 is a cross-sectional view showing a main portion of a thermoelectric module according to an exemplary embodiment of the present invention applied to the vehicle lamp of FIG. 2, and FIG. 7 is a view showing an example in which the structure of FIG. 6 is modularized and expanded.

The thermoelectric module 100 applied to the vehicle lamp according to an exemplary embodiment of the present invention may be implemented to have a structure in which a first semiconductor device 120 and a second semiconductor device 130 are arranged between the first substrate 140 and the second substrate 150 facing each other. In particular, a first thermal conversion unit 200 that performs a heat generating function may be arranged on the first substrate 140 so that the heat generating function may be performed, and a second thermal conversion unit 300 that performs a heat absorbing function may be provided on the second substrate 150 so that a cooling function may be performed. As will be described later, the first thermal conversion unit 200 may be defined as a module including the first thermal conversion member 52 of FIG. 2.

As to the thermoelectric module 100, a heat insulating substrate, for example, an alumina substrate may be used for the first substrate 140 and the second substrate 150, and according to another embodiment, a metal substrate may be used for the same, thereby achieving heat absorbing and heat generating efficiencies and thickness reduction. Obviously, when the metal substrate is formed as the first substrate 140 and the second substrate 150, it is preferable that dielectric layers 170a and 170b be further provided between each of electrode layers 160a and 160b formed on the first substrate 140 and the second substrate 150 and each of the first substrate 140 and the second substrate 150, as shown in FIG. 6.

In the case of the metal substrate, Cu or a Cu alloy may be used, and the thickness of the metal substrate capable of achieving thickness reduction may be formed in a range of 0.1 mm to 0.5 mm. When the thickness of the metal substrate is less than 0.1 mm or exceeds 0.5 mm, excessively high heat radiation characteristic or a thermal conductivity may be exhibited so that reliability of the thermoelectric module may be significantly reduced. In addition, in the case of the dielectric layers 170a and 170b, a material having thermal conductivity of 5 to 10 W/K may be used considering the thermal conductivity of the thermoelectric module for cooling with a dielectric material having high heat radiation performance, and the thickness of the dielectric layer may be formed in a range of 0.01 mm to 0.15 mm. In this case, when the thickness of the dielectric layer is less than 0.01 mm, the heat insulating efficiency (or voltage resistance characteristics) may be significantly reduced, and when the thickness of the dielectric layer exceeds 0.15 mm, the thermal conductivity may be reduced, resulting in a reduction in the heat radiation efficiency. The electrode layers 160a and 160b may electrically connect the first semiconductor device and the second semiconductor device using an electrode material including Cu, Ag, Ni, and the like and form electrical connection with an adjacent unit cell as shown in FIG. 7 when a plurality of unit cells are connected to the electrode layers 160a and 160b. The thickness of the electrode layer may be formed in a range of 0.01 mm to 0.3 mm. When the thickness of the electrode layer is less than 0.01 mm, electrode function may be deteriorated to cause poor electric conductivity, and when the thickness of the electrode layer exceeds 0.3 mm, the conduction efficiency may be reduced due to an increase in resistance.

In FIG. 7, a structure is exhibited in which a plurality of unit cells (each being constituted with a pair of thermoelectric semiconductor devices) are connected and modularized such as in the structure of FIG. 6, and particularly in this case, as will be described later, a thermoelectric device including a unit device of a stacked structure shown in FIG. 12 may be applicable as the thermoelectric device constituting the unit cell. In this case, a structure may be obtained in which one of the pair of thermoelectric devices may be a P-type semiconductor as the first semiconductor device 120, the other may be an N-type semiconductor as the second semiconductor device 130, and the first semiconductor device and the second semiconductor device may be respectively connected to the metal electrodes 160a and 160b. Here, a plurality of these structures may be formed, and Peltier effect may be achieved by circuit lines 181 and 182 through which a current is supplied to the semiconductor device via the electrode.

The material of the P-type semiconductor or the N-type semiconductor may be applied to the semiconductor device in the thermoelectric module. Here, the N-type semiconductor may be formed using a bismuth telluride-based main substance material (BiTe-based) including selenium (Se), nickel (Ni), aluminum (Al), copper (Cu), silver (Ag), lead (Pb), boron (B), gallium (Ga), tellurium (Te), bismuth (Bi), and indium (in) and a mixture mixed with Bi or Te corresponding to 0.001 wt % to 1.0 wt % of the total weight of the main substance material. For example, a Bi—Se—Te material may be used as the main substance material, and a weight of Bi or Te corresponding to 0.001 wt % to 1.0 wt % of the total weight of the Bi—Se—Te may be further added to form the N-type semiconductor. That is, when the Bi—Se—Te of 100 g is used, it is preferable that Bi or Te be further added in a range of 0.001 g to 1.0 g. When the weight of the material that is added to the above-described main substance material is outside the range of 0.001 wt % to 0.1 wt %, the electrical conductivity may be reduced without a reduction in the thermal conductivity, so that the improvement in a value ZT may not be expected.

As to the material of the P-type semiconductor, it is preferable that the P-type semiconductor be formed using a bismuth telluride-based main substance material (BiTe-based) including antimony (Sb), nickel (Ni), aluminum (Al), copper (Cu), silver (Ag), lead (Pb), boron (B), gallium (Ga), tellurium (Te), bismuth (Bi), and indium (in) and a mixture mixed with Bi or Te corresponding to 0.001 wt % to 1.0 wt % of the total weight of the main substance material. For example, a Bi—Sb—Te material may be used as the main substance material, and a weight of Bi or Te corresponding to 0.001 wt % to 1.0 wt % of the total weight of the Bi—Sb—Te may be further added to form the P-type semiconductor. That is, when the Bi—Sb—Te of 100 g is used, Bi or Te to be further added may be added in a range of 0.001 g to 1 g. When the weight of the material that is added to the above-described main substance material is outside the range of 0.001 wt % to 0.1 wt %, the thermal conductivity is not reduced and electrical conductivity may be reduced, so that the improvement in a value ZT may not be expected.

The shapes and sizes of the first semiconductor device and the second semiconductor device facing each other and constituting a unit cell may be the same. However, considering the difference between the electrical conductivity characteristics of the P-type semiconductor device and the N-type semiconductor device as a factor that lowers cooling efficiency, the volume of either the P-type semiconductor device or the N-type semiconductor device facing each other may be formed to be different from the volume of the other semiconductor device to improve the cooling performance.

That is, for forming the volumes of the semiconductor devices of the unit cell which are arranged to face each other to be different from each other, roughly a method may be used in which the overall shapes are formed to be different from each other, a diameter of a cross-section of any one of the semiconductor devices having the same height is larger than that of the other semiconductor device, or heights of the semiconductor devices having the same shape or diameters of cross-sections thereof are formed to be different from each other. In particular, the diameter of the N-type semiconductor device may be formed to be larger than that of the P-type semiconductor device to increase the corresponding volume, thereby improving the thermoelectric efficiency.

Figure 8:
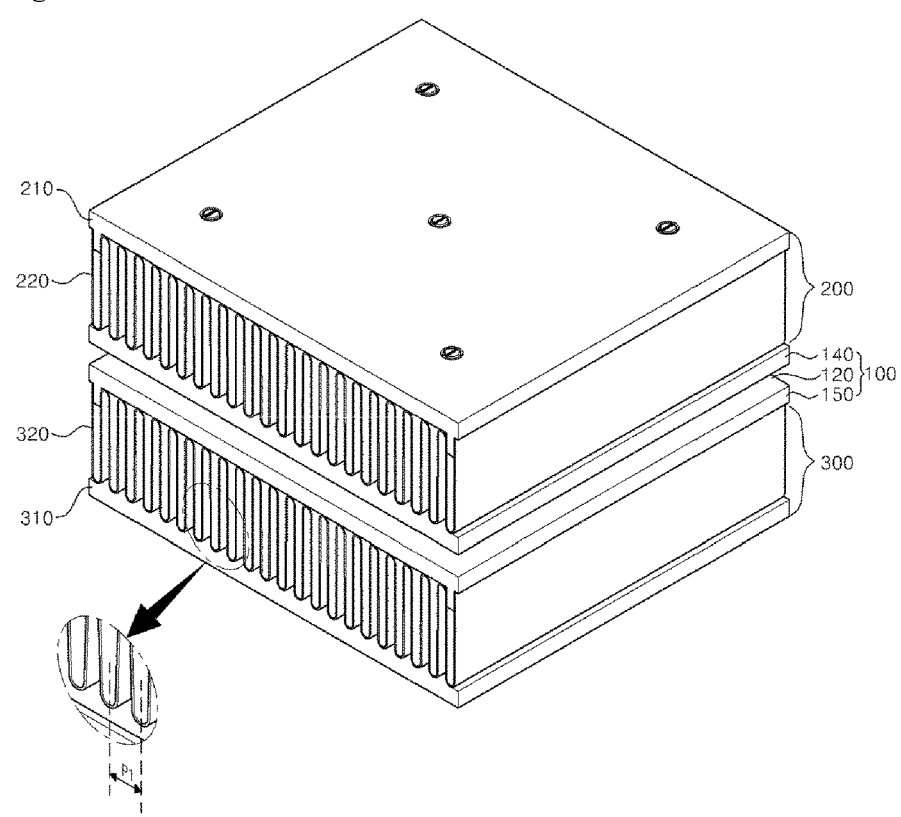
FIGS. 8 to 10 are conceptual views showing a main portion of a thermal conversion member applied to a thermoelectric module according to an exemplary embodiment of the present invention.

FIG. 8 is a view showing another embodiment of the thermoelectric module and the thermal conversion member which have been described in FIGS. 2 and 4. As to the structure of the first thermal conversion member described in FIG. 4, an example has been described in which a plurality of fin structures such as the radiation fin or a plurality of thin plate-shaped structures are arranged, but in the exemplary embodiment of FIG. 8, an example will be described in which a structure having a curvature is applied as the shape of the thermal conversion member to maximize the heat generating efficiency or the cooling efficiency.

Referring to FIG. 8, a structure is shown in which the first thermal conversion unit 200 is arranged on the thermoelectric module 100 including the thermoelectric semiconductor device between a pair of substrates and the second thermal conversion unit 300 is arranged below the thermoelectric module 100. The first thermal conversion unit 200 and the second thermal conversion unit 300 may perform thermal conversion of introduced air or discharged air using the thermoelectric effect achieved through the first substrate 140 and the second substrate 150 of the thermoelectric module 100. In particular, the first thermal conversion unit 200 may constitute a heat generating portion so that air passing through the first air-blowing module such as the blower fan in the structure of FIG. 2 may be converted into warm air via a first thermal conversion member (52 of FIG. 2 or 220 of FIG. 8). The first thermal conversion unit 200 may include the thermal conversion member 220 arranged on the first substrate 140. Such a structure may be the same as the structure in which the second thermal conversion unit 300 includes a second thermal conversion member 320 arranged on the second substrate 150, and therefore a structure in which the thermal conversion member 220 of the first thermal conversion unit 200 is provided will be described.

The thermal conversion unit 200 may be arranged to be brought into contact with the first substrate 140 as shown in FIG. 8, and this may cause the air passing through the first thermal conversion member 220 of the thermal conversion unit 200 to be converted into warm air whose temperature is increased by a heat generating action, and the warm air may be supplied to the lens unit via the air flow passage unit of FIG. 2.

As shown in the structure of FIG. 8, the first thermal conversion member 220 within the first thermal conversion unit 200 that performs a heat generating function and the second thermal conversion member 320 within the second thermal conversion unit 300 that performs a heat absorbing function may be directly brought into contact with the first substrate 140 and the second substrate 150, but they may also be formed to be arranged within separate receiving modules 210 and 310.

Figure 9:
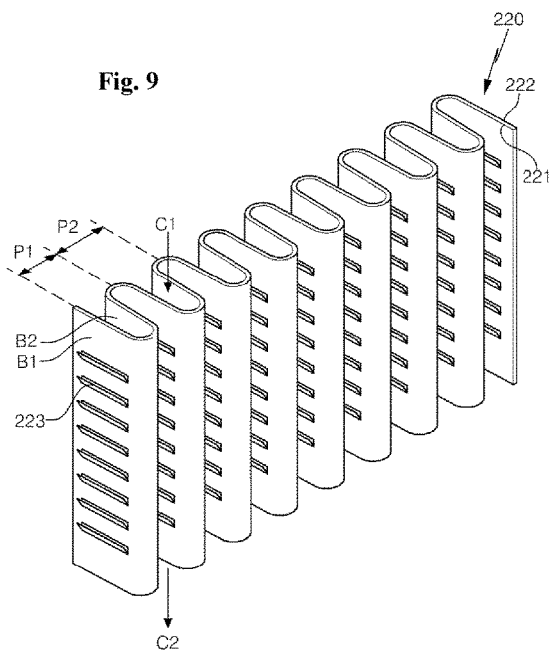
Figure 10:
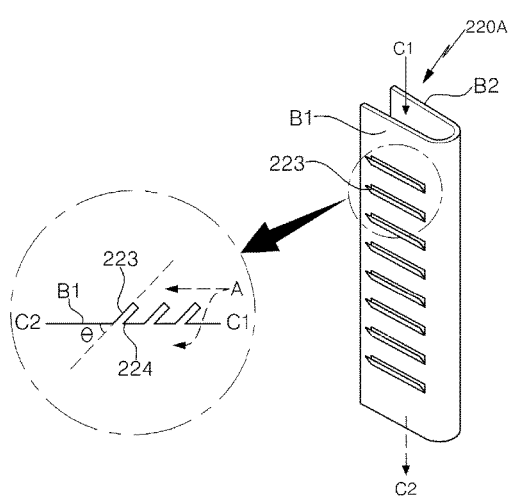

FIG. 9 is a view showing specification of the structure of the first thermal conversion member 220 described in FIG. 8 according to an exemplary embodiment of the present invention, and FIG. 10 is an enlarged schematic view showing a structure in which a single flow passage pattern 220A is formed in the first thermal conversion member 220. This structure may be applied to the second thermal conversion member 320 in the same manner, and hereinafter, the structure of the first thermal conversion member 220 will be mainly described.

As shown in FIG. 9, the first thermal conversion member 220 may be formed to have a structure in which one or more flow passage patterns 220A which form an air flow passage C1, that is, a movement passage for a constant amount of air on a flat plate-shaped substrate of a first plane 221 and a second plane 222 facing the first plane 221 for performing surface contact with air.

As shown in FIG. 9, the flow passage patterns 220A may also be achieved by having a curvature pattern having constant pitches P1 and P2 and a height T1 formed by folding the substrate. That is, the thermal conversion members 220 and 320 according to an exemplary embodiment of the present invention may be achieved by providing two planes in which surface contact with air is performed and forming the flow passage pattern for maximizing the surface area in contact with air.

In the structure shown in FIG. 9, when air is introduced in a direction of the flow passage C1 of an inlet through which air is introduced, the introduced air may move toward a direction of a distal end C2 of the flow passage while being evenly in contact with the above-described first plane 221 and second plane 222 facing the first plane 221, and this may induce a contact with a much larger amount of air compared to a contact area between air and a simple flat plate so that the effect of heat absorbing or heat generating may be further enhanced.

In particular, in order to further increase the contact area with air, the thermal conversion member 220 according to an exemplary embodiment of the present invention may include a flow resistance pattern 223 on the surface of the substrate as shown in FIGS. 9 and 10. The flow resistance pattern 223 may be formed on each of a first curved surface B1 and a second curved surface B2 considering a unit flow passage pattern. The resistance pattern may be formed to protrude in a direction of either the first plane or the second plane facing the first plane. In addition, the first thermal conversion member 220 may further include a plurality of fluid flow grooves 224 penetrating through the surface of the substrate so that air contact and movement between the first plane and the second plane of the first thermal conversion member 220 may be more easily achieved.

In particular, as shown in a partially enlarged view of FIG. 10, the resistance pattern 224 may be formed to protrude with an inclination angle θ in the direction against which air enters so that the friction with the air may be maximized, thereby further enhancing the contact area or the contact efficiency. As to the inclination angle θ, it is more preferable that a horizontal extension of the surface of the resistance pattern and an extension of the surface of the substrate form an acute angle, and this is because the effect of resistance may be reduced when the inclination angle θ is a right angle or an obtuse angle.

In addition, the above-described fluid flow grooves 224 may be arranged in a connection portion between the resistance pattern and the substrate so that the resistance of a fluid such as air may be increased and the movement of air toward the opposite surface may be efficient at the same time. Specifically, the fluid flow grooves 224 may be formed on the substrate surface of the front portion of the flow resistance pattern 223 so that a part of air in contact with the flow resistance pattern 223 may pass through a front surface and a rear surface of the substrate, thereby further increasing the number of times of the contact or the contact area.

As shown in FIG. 10, the flow passage pattern may be formed to have a constant pitch at a constant period of the pattern, but the flow passage pattern may obviously be formed otherwise to have a non-uniform pitch of a unit pattern and at a non-uniform period of the pattern and also formed to have a non-uniform height T1 of each unit pattern.

In FIGS. 8 to 10, a structure in which a single first thermal conversion member is included in the thermoelectric module in a heat transmission apparatus according to an exemplary embodiment of the present invention has been described, but according to another exemplary embodiment, a plurality of thermal conversion members may be stacked within a single thermoelectric module. Accordingly, the contact surface area with air or the like may be further maximized, and a large number of contact surfaces may be achieved within a small area due to unique characteristics of the thermal conversion member of the present invention which is in a folding structure so that a larger number of thermal conversion members may be arranged within the same volume. Obviously, in this case, a support substrate such as a second intermediate member may be further arranged between the stacked thermal conversion members. In addition, according to still another exemplary embodiment of the present invention, two or more thermoelectric modules may be provided.

In addition, a pitch of the first thermal conversion member of the thermoelectric module (first substrate) that forms the heat generating portion and a pitch of the second thermal conversion member of the thermoelectric module (second substrate) that forms a heat absorbing portion may be formed differently from each other. In this case, particularly, the pitch of the flow passage pattern of the thermal conversion member within the thermoelectric module that forms the heat generating portion may be formed to be equal to or larger than the pitch of the flow passage pattern of the thermal conversion member within the thermoelectric module that forms the heat absorbing portion. In this case, a ratio of the pitch of the first thermal conversion member of the first thermal conversion unit and the pitch of the flow passage pattern of the first thermal conversion member of the second thermal conversion unit may be formed in a range of 0.5 to 2.0:1.

In the structure of the thermal conversion member according to an exemplary embodiment of the present invention which forms the flow passage pattern, a much larger contact area may be achieved within the same volume compared to the structure of the flat plate-shaped thermal conversion member or the structure of the conventional radiation fin, and this leads to an increase in the air contact area of 50% or more compared to the flat plate-shaped thermal conversion member, thereby significantly reducing the size of the module. In addition, in such a thermal conversion member, a variety of members made of metallic materials with high heat transfer efficiency including aluminum, synthetic resin, and the like may be used.

Hereinafter, a modified embodiment will be described in which the heat generating efficiency can be increased by changing the shape of the thermoelectric semiconductor device provided in the thermoelectric module 100 applied to the structure of FIG. 2.

Figure 11:
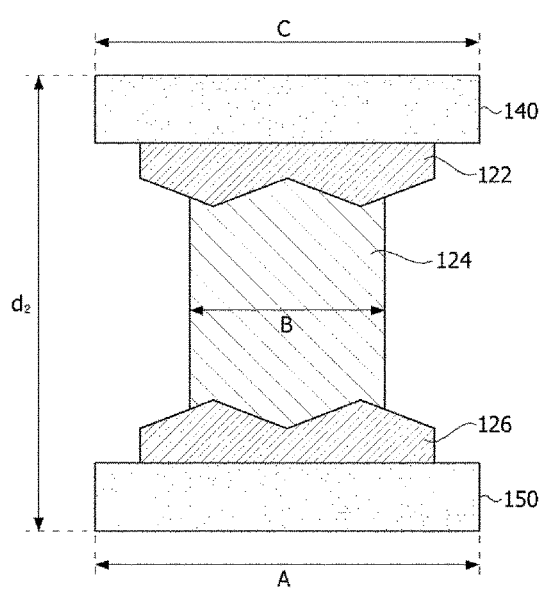
FIGS. 11 to 14 are implementation schematic views showing another embodiment of a thermoelectric device applied to a thermoelectric module according to an exemplary embodiment of the present invention.

That is, the changed shape of the thermoelectric semiconductor device of FIG. 11 may be applied to the unit structure of the thermoelectric module of FIG. 6. Referring to FIGS. 6 and 11, the thermoelectric device 120 according to another modified embodiment of the present invention may include a first device portion 122 that has a first cross-sectional area, a second device portion 126 that faces the first device portion 122 and has a second cross-sectional area, and a connection portion 124 that connects the first device portion 122 and the second device portion 126 and has a third cross-sectional area. In particular, in this case, a cross-sectional area in a horizontal arbitrary region of the connection portion 124 may be formed to be smaller than the first cross-sectional area and the second cross-sectional area.

In this structure, when the same amount of material as that of a thermoelectric device having a single cross-sectional area of a cube is applied, the area of each of the first element portion and the second element portion may be increased and the length of the connection portion may be made long so that there may be an advantage of increasing a temperature difference ΔT between the first device portion and the second device portion. When the temperature difference is increased, an amount of free electrons moving between a hot side and a cold side is increased and causes an increase in electric power, and the efficiency is increased in the case of heat generating or cooling.

Accordingly, in the thermoelectric device 120 according to the present embodiment, a wide horizontal cross-sectional area of each of the first device portion and the second device portion which are formed above and below the connection portion 124 to have a flat plate structure or other three-dimensional structures may be formed, and the length of the connection portion may be increased, thereby narrowing the cross-sectional area of the connection portion. In particular, in the present embodiment of the present invention, a ratio of a width B of the cross-section having the longest width among the horizontal cross-sections of the connection portion and a width A or C of the larger cross-section of the horizontal cross-sections of the first device portion and the second device portion may be formed within a range of 1:1.5 to 4. When the ratio is outside the range, the thermal conductivity may be transmitted from the hot side to the cold side, causing a reduction in the power generation efficiency or a reduction in the heat generating efficiency or the cooling efficiency.

According to another embodiment of such a structure, in the thermoelectric device 120, longitudinal thicknesses a1 and a3 of the first device portion and the second device portion may be formed to be smaller than a longitudinal thickness s2 of the connection portion.

In addition, in the present embodiment, the first cross-sectional area that is a horizontal cross-sectional area of the first device portion 122 and the second cross-sectional area that is a horizontal cross-sectional area of the second device portion 126 may be formed differently from each other. This is for easily controlling a desired temperature difference by adjusting the thermoelectric efficiency. In addition, the first device portion, the second device portion, and the connection portion may be formed integrally with one another, and in this case, each of the components may be made of the same material.

Figure 12:
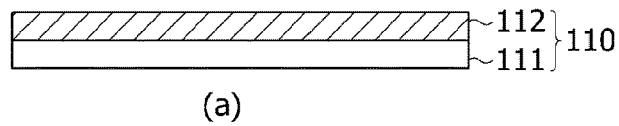
Figure 12:
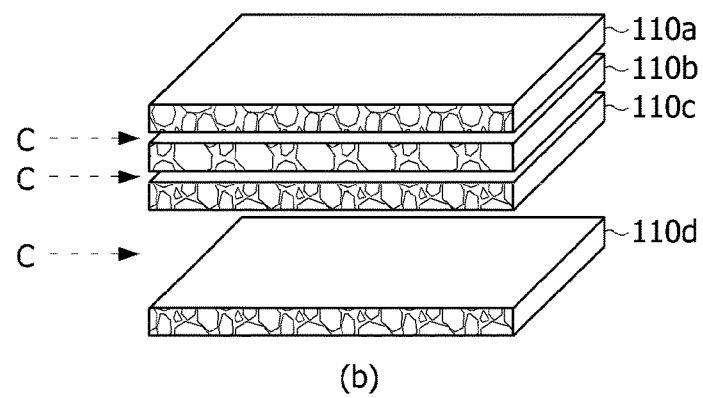
Figure 12:
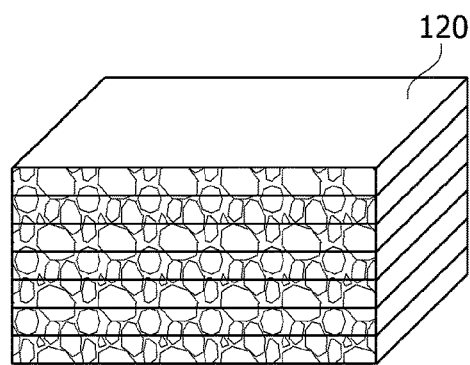
Figure 12:
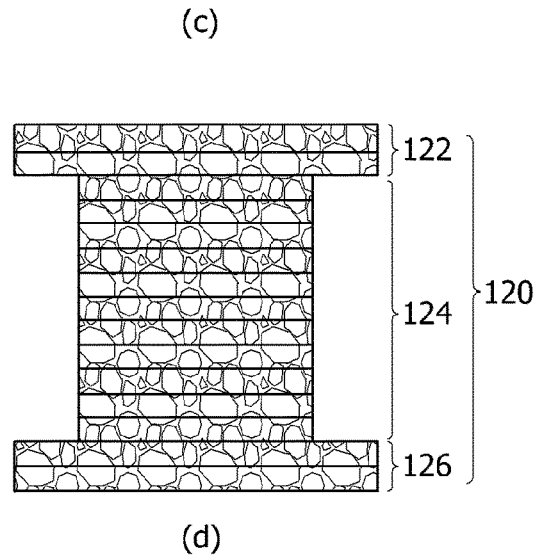

FIG. 12 is a view showing an example in which the structure of the above-thermoelectric semiconductor device according to an embodiment of the present invention which has been described in FIGS. 6 and 11 is implemented in a different method and different configuration.

Referring to FIG. 12, according to still another embodiment of the present invention, the above-described semiconductor device may be implemented in a stacked structure rather than a bulk structure, thereby further achieving the thickness reduction and improving the cooling efficiency. Specifically, the first semiconductor device 120 and the second semiconductor device 130 of FIG. 6 or 11 may be formed as a unit member in which a plurality of structures coated with a semiconductor material are stacked on a sheet-shaped substrate, and then the unit member may be cut to prevent the loss of material and improve the electrical conductivity.

FIG. 12 is a conceptual view showing a process for manufacturing the above-described unit member in the stacked structure. Referring to FIG. 12, a material containing a semiconductor material may be produced in a paste form, and then the paste may be applied on a substrate including a sheet, a film, or the like to form a semiconductor layer 112, thereby forming a single unit member 110. The unit member 110 may form a stacked structure by stacking a plurality of unit members 100a, 100b, and 100c, and then a unit thermoelectric device 120 may be formed by cutting the stacked structure as shown in FIG. 12. That is, the unit thermoelectric device 120 according to the present invention may be formed as a structure in which a plurality of unit members 110 each obtained by stacking the semiconductor layer 112 on the substrate 111 are stacked.

In the above-described processes, a process of applying a semiconductor paste on the substrate 111 may be implemented using a variety of methods, and as an example, tape casting, that is, a method made be used in which a slurry is manufactured by mixing very fine semiconductor material powder with any one selected from an aqueous or non-aqueous solvent and binder, a plasticizer, a dispersant, a defoamer, and a surfactant, and then the manufactured slurry is molded with a constant thickness on a moving blade or a moving substrate carrier. In this case, a material such as a film, a sheet, or the like with a thickness of 10 μM to 100 μm may be used for the substrate, and obviously, a P-type material and an N-type material of the above-described bulk device may be used as-is for the applied semiconductor material.

As to a process of aligning and laminating the unit member 110 in a multi-layer structure, the unit member 100 may be compressed at a temperature of 50° C. to 250° C. to be formed in the stacked structure, and according to the embodiment of the present invention, the number of stacked unit members 110 may be achieved in a range of 2 to 50. Next, a cutting process may be performed to have a desired shape and size, and a sintering process may be added.

The unit thermoelectric device formed by stacking a plurality of unit members 100 each being manufactured according to the above-described process may ensure uniformity of thickness, shape, and size. That is, in the conventional bulk thermoelectric device, the sintered bulk structure may be cut after an ingot grinding and fine ball-milling process. Accordingly, there are problems where a large amount of the material is lost in the cutting process, cutting the bulk structure to a uniform size is difficult, and achieving thickness reduction is difficult due to the large thickness of 3 mm to 5 mm. However, in the unit thermoelectric device having the stacked structure according to the embodiment of the present invention, sheet-shaped unit members may be stacked in a multi-layer structure, and then the stacked structure may be cut, and therefore there is almost no material loss, the uniformity of the material may be ensured due to the material with a uniform thickness, the thickness reduction may be achieved due to the unit thermoelectric device with the total thickness of 1.5 mm or less, and applying the unit thermoelectric device having various shapes becomes possible.

The finally obtained structure may be cut into a shape of (d) of FIG. 12 as shown in the structure of the thermoelectric device according to an embodiment of the present invention described in FIG. 6 or 11.

In particular, in the manufacturing processes of the unit thermoelectric device according to the embodiment of the present invention, a process of forming a conductive layer on the surface of each of the unit members 110 may be further provided during the process of forming the stacked structure of the unit member 100.

Figure 13:
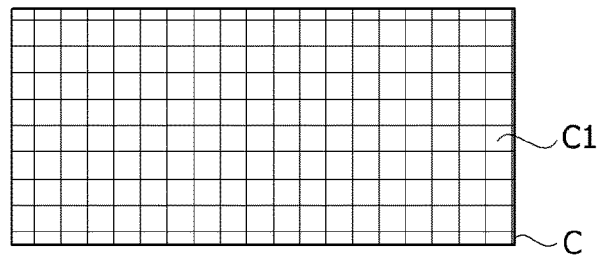
Figure 13:
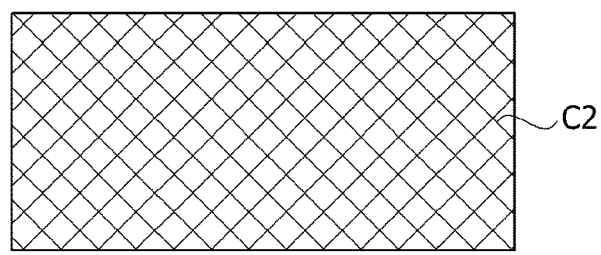
Figure 13:
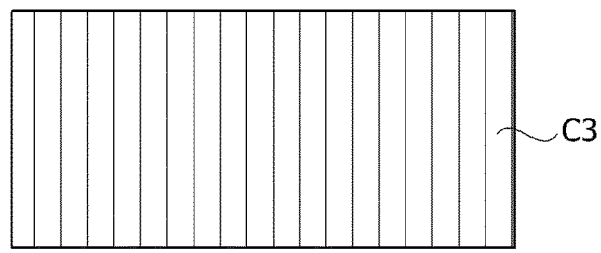
Figure 13:
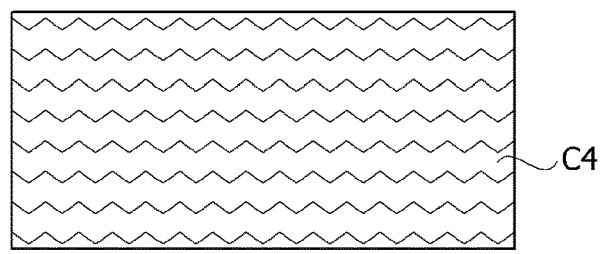

That is, a conductive layer having the structure shown in FIG. 13 may be formed between the unit members of the stacked structure of (c) of FIG. 12. The conductive layer may be formed on the opposite surface of the substrate surface on which the semiconductor layer is formed, and in this case, the conductive layer may be implemented as a patterned layer so that an area in which the surface of the unit member is exposed may be formed. Accordingly, it is possible to improve the bonding force between the unit members while increasing the electrical conductivity compared to a case of the entire surface coating and to reduce the thermal conductivity.

That is, a variety of modified examples of the conductive layer C according to the embodiment of the present invention are shown in FIG. 13, and the pattern in which the surface of the unit member is exposed may be variously modified and designed into a mesh-type structure including closed opening patterns $c_1$ and $c_2$ shown in (a) and (b) of FIG. 13 or a line-type structure including opened opening patterns $c_3$ and $c_4$ shown in (c) and (d) of FIG. 13. The conductive layer has advantages of increasing the adhesive force between the unit members inside the unit thermoelectric device formed in the stacked structure of the unit members, thus reducing the thermal conductivity between the unit members, and improving the electrical conductivity. In addition, by virtue of the conductive layer, cooling capacity Qc and temperature variation $\Delta T(° C.)$ may be improved compared to the conventional bulk thermoelectric device, and particularly, a power factor, that is, electrical conductivity may be increased 1.5 times. The increase in the electrical conductivity may be directly related to the improvement in the thermoelectric efficiency, thus leads to improved cooling efficiency. The conductive layer may be made of a metallic material, and metallic electrode materials such as Cu, Ag, Ni, and the like may be all used as the conductive layer.

When the unit thermoelectric device of the stacked structure described in FIG. 12 is applied to the thermoelectric module shown in FIGS. 6 and 7, that is, when the thermoelectric device according to the embodiment of the present invention is arranged between the first substrate 140 and the second substrate 150 and the thermoelectric module is implemented in a unit sell including an electrode layer and a dielectric layer, the total thickness Th may be formed in a range of 1.0 mm to 1.5 mm, so that a significant thickness reduction may be achieved compared to a case of using the conventional bulk device. In this case, when a dew condensation removal device of the vehicle lamp according to the embodiment of the present invention described in FIG. 2 is implemented, the dew condensation removal device may be efficiently utilized in a limited space.

Figure 14:
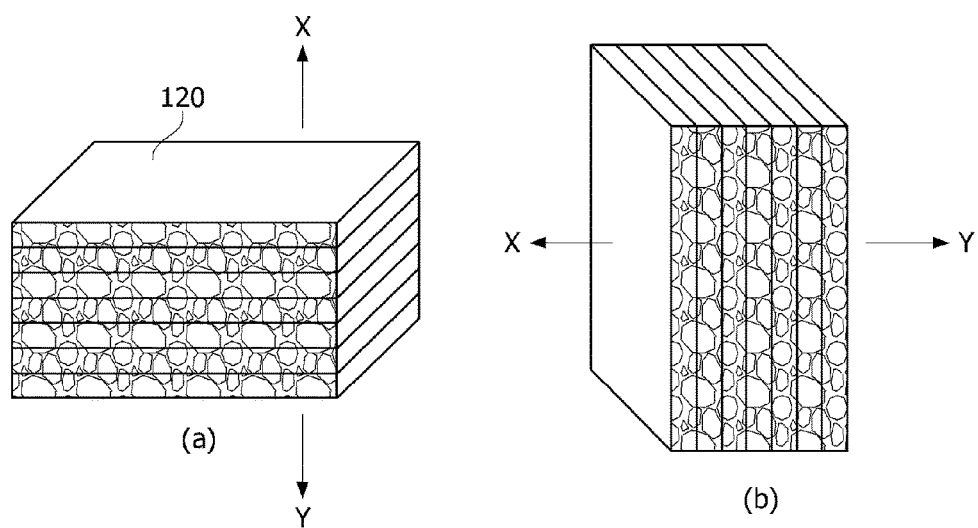
Figure 14:
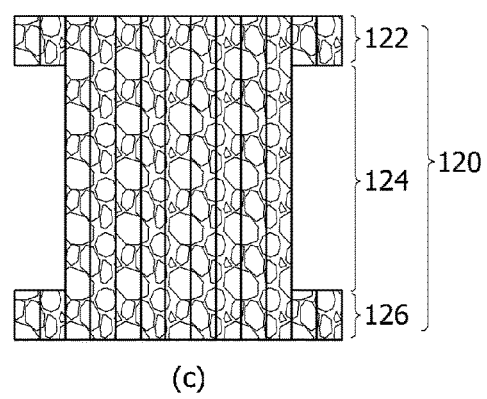

In addition, as shown in FIG. 14, the thermoelectric devices 120 and 130 described in FIG. 9 may be aligned to be arranged parallel to an upward direction X and a downward direction Y as shown in (a) of FIG. 14, and then cut as shown in (c) to implement the thermoelectric device according to the embodiment of the present invention.

That is, the thermoelectric module may be formed in a structure in which the first substrate, the second substrate, the semiconductor layer, and the surface of the substrate are arranged to be adjacent to each other, but as shown in (b) of FIG. 14, a structure in which the thermoelectric device itself may be erected vertically so that a side surface portion of the unit thermoelectric device may be arranged to be adjacent to the first and second substrates may be possible. In this structure, a distal end portion of the conductive layer may be exposed compared to the horizontal arrangement structure and thereby may improve the electrical conductivity while lowering the heat conduction efficiency in the vertical direction, thereby further increasing the cooling efficiency. In addition, the shape of FIG. 11 may be cut as shown in (c) of FIG. 14 to be implemented and applied to the corresponding structure.

As described above, in the thermoelectric device applied to the thermoelectric module of the present invention which can be implemented in various embodiments, the shapes and sizes of the first semiconductor device and the second semiconductor device facing each other may be the same, but in this case, in consideration of the fact that a difference in the electrical conductivity between the P-type semiconductor device and the N-type semiconductor device acts as a factor that reduces the cooling efficiency, the volume of either the P-type semiconductor device or the N-type semiconductor device facing each other may be formed to be different from the volume of the other semiconductor device, thereby improving the cooling performance.

That is, for forming the volumes of the semiconductor devices which are arranged to face each other to be different from each other, roughly a method may be used in which the overall shapes are formed to be different from each other, a diameter of a cross-section of any one of the semiconductor devices having the same height is larger than that of the other semiconductor device, or heights of the semiconductor devices having the same shape or diameters of cross-sections thereof are formed to be different from each other. In particular, the diameter of the N-type semiconductor device may be formed to be larger than that of the P-type semiconductor device to increase the corresponding volume, thereby improving the thermoelectric efficiency.

The above-described thermoelectric device of various structures according to an embodiment of the present invention and the thermoelectric module including the same may be applied to a structure in which warm air is implemented in the air flow passage unit inside the vehicle lamp shown in FIG. 2 as described above.

According to the embodiment of the present invention, the air flow passage unit may be provided in the bezel unit provided essentially in the vicinity of the light source of the vehicle lamp and thereby simplify the air blowing structure, and air may be selectively provided to a local area of the lens surface and thereby remarkably reduce the capacity of the thermoelectric module and the air-blowing module.

That is, the thermoelectric circulating unit according to the embodiment of the present invention may fundamentally prevent the generation of dew condensation in a manner such that air heated by the thermoelectric module may increase the lens surface temperature of the head lamp, and particularly in this case, warm air or hot air may be selectively provided to a partial area in which dew condensation is generated.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A vehicle lamp comprising:
   a housing;
   a lens unit that is provided on a front surface of the housing;
   a light source unit that is arranged to be spaced apart from the lens unit by a predetermined distance and thereby forms a separation space;
   a thermoelectric module that is provided inside the housing;
   an air flow passage unit that provides an air movement passage between the thermoelectric module and the separation space; and
   a thermoelectric circulating unit that provides power so that air passing through the thermoelectric module is discharged to the separation space along the air movement passage,
   wherein the thermoelectric module includes a plurality of thermoelectric semiconductor devices between a first substrate and a second substrate which face each other and is arranged in such a manner that a heat generating area is implemented in the first substrate,
   wherein a first thermal conversion member arranged on the first substrate and a first end of the air flow passage unit communicate with each other, and
   wherein a second thermal conversion member arranged on the second substrate is exposed to the outside of the air flow passage unit.

2. The vehicle lamp of claim 1, wherein a second end of the air flow passage unit communicates with the separation space.

3. The vehicle lamp of claim 2, further comprising:
   a bezel unit that is provided in the separation space.

4. The vehicle lamp of claim 3, wherein the air flow passage unit is provided inside the bezel unit.

5. The vehicle lamp of claim 3, wherein the air flow passage unit is provided on an outer surface of the bezel unit.

6. The vehicle lamp of claim 1, wherein a vertical cross-sectional area of the first thermal conversion member and a vertical cross-sectional area of the first end of the air flow passage are the same with a predetermined tolerance.

7. The vehicle lamp of claim 6, wherein the thermoelectric circulating unit communicates with the first end of the air flow passage unit through the first thermal conversion member and includes one or more first air-blowing modules.

8. The vehicle lamp of claim 1,
   wherein the second thermal conversion member is arranged on the second substrate in which a heat absorbing area is implemented.

9. The vehicle lamp of claim 7, wherein the second thermal conversion member is provided to be spaced apart from the first thermal conversion member by a predetermined distance.

10. The vehicle lamp of claim 7, further comprising:
    one or more second air blowing modules that is arranged inside the air flow passage unit.

11. The vehicle lamp of claim 3, wherein the second end of the air flow passage unit is connected to an air discharge portion exposed to surface areas of the bezel unit.

12. The vehicle lamp of claim 11, wherein the air discharge portion is provided in at least two areas of the surface areas of the bezel unit.

13. The vehicle lamp of claim 12, wherein the air discharge portion is provided to discharge air in a downward direction of the lens unit.

14. The vehicle lamp of claim 12, wherein the air discharge portion is provided to discharge air in an edge direction of the lens unit.

15. The vehicle lamp of claim 13, wherein the air discharge portion is provided in at least one structure of a wedge-shaped hole structure and a slit structure.

16. The vehicle lamp of claim 1, further comprising:
    a temperature sensor unit that detects a temperature difference between the separation space inside the housing and the outside of the housing.

17. The vehicle lamp of claim 16, further comprising:
    a control unit that controls an operation of the thermoelectric circulating unit according to the temperature difference.

18. A vehicle that includes the vehicle lamp according to claim 1.

\* \* \* \* \*